US010575392B2

(12) United States Patent
Ochi et al.

(10) Patent No.: US 10,575,392 B2
(45) Date of Patent: Feb. 25, 2020

(54) COOLING SYSTEM

(71) Applicant: FUJITSU LIMITED, Kawasaki-shi, Kanagawa (JP)

(72) Inventors: Yoshiteru Ochi, Hadano (JP); Hidehisa Sakai, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/264,721

(22) Filed: Feb. 1, 2019

(65) Prior Publication Data
US 2019/0281690 A1 Sep. 12, 2019

(30) Foreign Application Priority Data

Mar. 12, 2018 (JP) ................. 2018-044691

(51) Int. Cl.
H05K 1/02 (2006.01)
H05K 7/20 (2006.01)
F24F 9/00 (2006.01)
F28F 9/00 (2006.01)

(52) U.S. Cl.
CPC ........... *H05K 1/0203* (2013.01); *F28F 9/002* (2013.01); *H05K 7/20327* (2013.01); *H05K 2201/064* (2013.01); *H05K 2201/10393* (2013.01); *H05K 2201/10409* (2013.01)

(58) Field of Classification Search
CPC ... H01L 23/473; H01L 23/427; H01L 23/467; H01L 23/4006; H01L 23/3735; H05K 7/20927; H05K 1/189; H05K 7/20336; H05K 2201/10106; H05K 7/20509; H05K 7/20772; H05K 1/14; H05K 7/20254; H05K 1/0203; H05K 7/1432; H05K 1/181; H05K 5/02; H05K 7/2039; H05K 7/20809; H05K 1/0209; H05K 7/20936; H05K 2201/10159; H05K 3/0061; H05K 2201/10393; H05K 2201/10409; H05K 2201/064

See application file for complete search history.

(56) References Cited

U.S. PATENT DOCUMENTS

| 3,917,370 A | * | 11/1975 | Thornton | ............... H01L 23/473 439/194 |
| 4,783,721 A | * | 11/1988 | Yamamoto | ............ G02F 1/0036 257/714 |
| 6,075,703 A | * | 6/2000 | Lee | ..................... H01L 23/4093 174/16.3 |

(Continued)

FOREIGN PATENT DOCUMENTS

JP  2016-213314  12/2016

Primary Examiner — Adam B Dravininkas
(74) Attorney, Agent, or Firm — Fujitsu Patent Center

(57) ABSTRACT

A cooling system includes a heat exchanger provided on a heat generating component, the heat exchanger having a size larger than the heat generating component, a leaf spring to extend from a first side of an upper surface of the heat exchanger to a second side opposite to the first side, and be fixed to the upper surface of the heat exchanger, a first screw to be arranged around the heat exchanger, and to fix the leaf spring to a printed circuit board, and a convex portion to be raised to be higher than a first portion of the first side and a second portion of the second side, and to be formed at a central portion between first and second portions within a region of the upper surface of the heat exchanger that overlaps with the leaf spring.

11 Claims, 9 Drawing Sheets

(56) References Cited

U.S. PATENT DOCUMENTS

| | | | | |
|---|---|---|---|---|
| 6,179,047 B1* | 1/2001 | Tustaniwskyj | ...... | H01L 23/4006 |
| | | | | 165/185 |
| 6,639,800 B1* | 10/2003 | Eyman | ................ | H01L 23/4006 |
| | | | | 165/185 |
| 6,724,629 B1* | 4/2004 | Augustin | ............ | H01L 23/4093 |
| | | | | 165/80.3 |
| 7,777,329 B2* | 8/2010 | Colbert | .............. | H01L 23/4093 |
| | | | | 257/712 |
| 9,784,506 B2* | 10/2017 | Teraki | ................... | H01L 23/473 |
| 2005/0128713 A1* | 6/2005 | Schmidberger | ..... | H01L 23/4006 |
| | | | | 361/719 |
| 2010/0053897 A1* | 3/2010 | Kusaka | .................. | G06F 1/203 |
| | | | | 361/697 |
| 2014/0085824 A1* | 3/2014 | Wavering | ............ | H01L 23/3735 |
| | | | | 361/701 |
| 2016/0327996 A1* | 11/2016 | Sasabe | ..................... | H05K 7/20 |
| 2017/0014929 A1* | 1/2017 | So | ........................ | B23K 1/0016 |

\* cited by examiner

COOLING SYSTEM

CROSS-REFERENCE TO RELATED APPLICATION

This application is based upon and claims the benefit of priority of the prior Japanese Patent Application No. 2018-044691, filed on Mar. 12, 2018, the entire contents of which are incorporated herein by reference.

FIELD

The present disclosure relates to a cooling system.

BACKGROUND

Various methods for cooling a heat generating component mounted on a printed circuit board are known. For example, a configuration is known in which a heat exchanger provided on a heat generating component is brought into a close contact with the heat generating component using a leaf spring.

Related techniques are disclosed in, for example, Japanese Laid-open Patent Publication No. 2016-213314.

SUMMARY

According to an aspect of the invention, a cooling system includes a heat exchanger configured to be provided on a heat generating component mounted on a printed circuit board to cool the heat generating component, the heat exchanger having a size that is larger than the heat generating component as viewed in a thickness direction of the printed circuit board, a leaf spring configured to extend from a first side of an upper surface of the heat exchanger to a second side opposite to the first side, and be fixed to the upper surface of the heat exchanger, a first screw configured to be arranged around the heat exchanger, and fix the leaf spring to the printed circuit board, and a convex portion configured to be raised to be higher than a first portion of the first side and a second portion of the second side, and be formed at a central portion between the first portion and the second portion within a region of the upper surface of the heat exchanger that overlaps with the leaf spring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the configuration disclosed in Japanese Laid-open Patent Publication No. 2016-213314, warping occurs in the heat exchanger, and in some cases, a contact area between the heat generating component and the heat exchanger may be reduced. In this case, the cooling effect on the heat generating component deteriorates.

In the following, embodiments of a technology capable of reducing warping of a heat exchanger will be described with reference to the drawings.

First Embodiment

Figure 1:
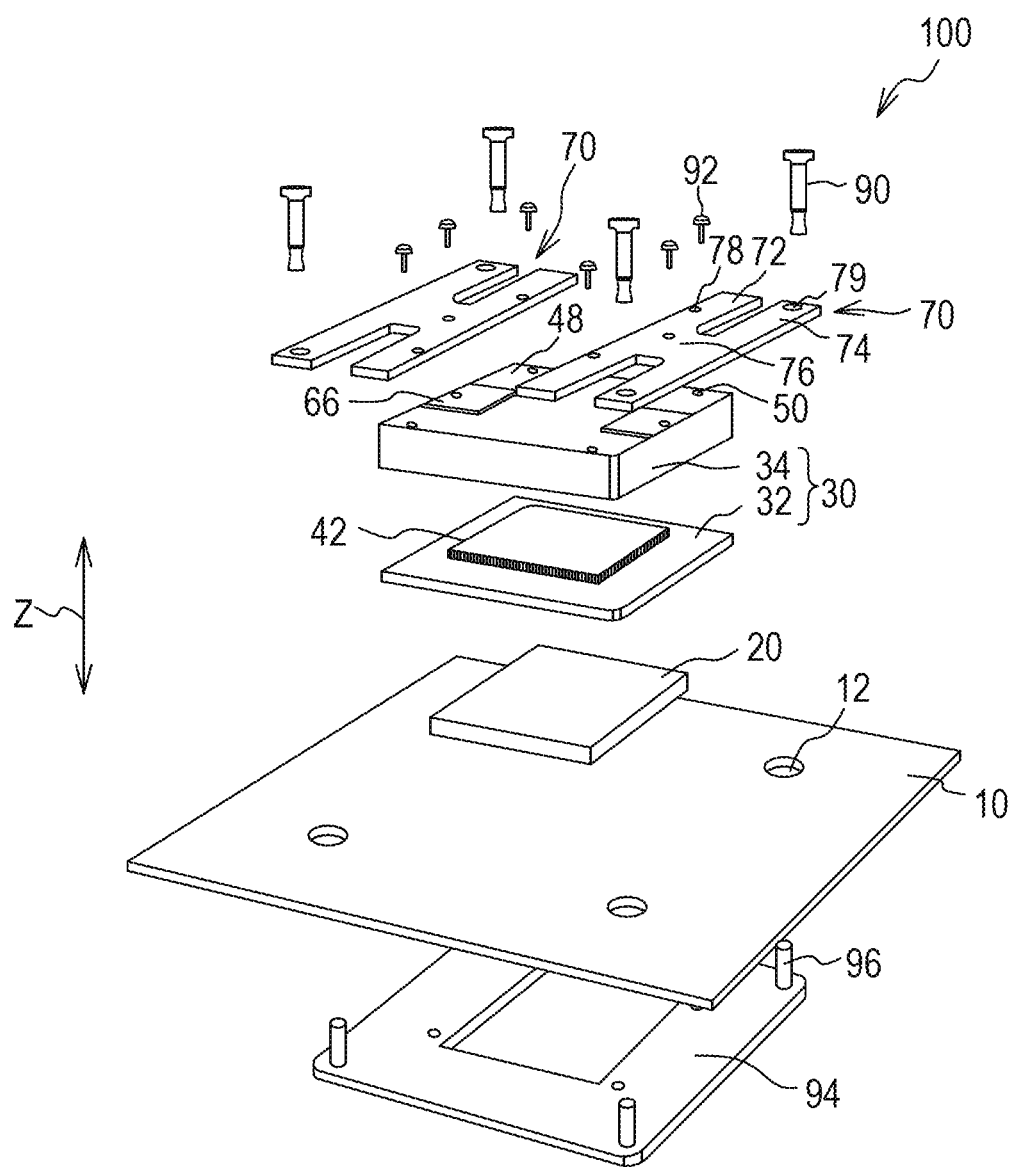
FIG. 1 is an exploded perspective view illustrating a cooling system according to a first embodiment.

FIG. 1 is an exploded perspective view illustrating a cooling system according to a first embodiment. As illustrated in FIG. 1, a cooling system 100 of the first embodiment includes a printed circuit board 10, a heat generating component 20, a heat exchanger 30, leaf springs 70, a plurality of screws 90, a plurality of screws 92, and a mounting plate 94.

The printed circuit board 10 is, for example, a printed circuit board. Printed circuit (not illustrated) is formed on, for example, an upper surface of the printed circuit board 10. The heat generating component 20 is mounted on the upper surface of the printed circuit board 10 by bumps such as solder. The heat generating component 20 is, for example, an electronic component, and as an example, a semiconductor component such as a large scale integration (LSI) package. The heat generating component 20 may be a component other than electronic components as long as the component generates heat. An arrow Z appropriately illustrated in each drawing indicates a thickness direction of the printed circuit board 10.

The heat exchanger 30 is provided on the heat generating component 20. The heat exchanger 30 is formed by joining a bottom plate portion 32 having a flat plate shape and a cover portion 34 having a concave shape with, for example, an adhesive. A lower surface of the bottom plate portion 32 is in contact with, for example, the upper surface of the heat generating component 20. The heat generating component 20 is cooled by the heat exchanger 30. Heat conductive sheet or heat conductive grease may be interposed between the bottom plate portion 32 and the heat generating component 20 to enhance heat transfer efficiency.

Since the heat exchanger 30 has a larger shape than the heat generating component 20 when viewed from the thickness direction of the printed circuit board 10, the heat exchanger 30 is provided on the heat generating component 20 in a state where the outer peripheral portion thereof protrudes outward from the heat generating component 20. As an example, the heat generating component 20 has a rectangular parallelepiped shape having a size of length× width×height of about 50 mm×65 mm×5 mm, and the heat exchanger 30 has a rectangular parallelepiped shape having a size of length×width×height of about 75 mm×75 mm×15 mm.

Figure 2:
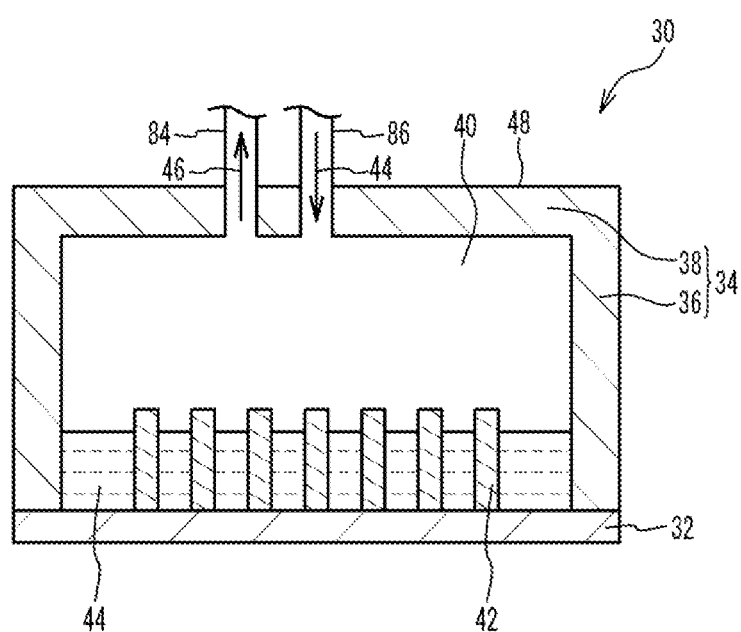
FIG. 2 is a cross-sectional view illustrating a heat exchanger.

FIG. 2 is a cross-sectional view illustrating the heat exchanger. As illustrated in FIG. 2, the cover portion 34 of the heat exchanger 30 includes an upper wall portion 38, and a side wall portion 36 having a frame shape. In the heat exchanger 30, a surface of the side wall portion 36 opposite to the upper wall portion 38 is joined to the bottom plate portion 32 with, for example, an adhesive. As an example, a width of the side wall portion is about 8 mm, and a thickness of the bottom plate portion 32 is about 3 mm. In the heat exchanger 30, a space 40 is formed therein by joining the side wall portion 36 of the cover portion 34 to the bottom plate portion 32. A liquid phase refrigerant 44 such as water supplied from a condenser 82 to be described later is stored in the space 30. A refrigerant in liquid phase state is referred to as a "liquid phase refrigerant", and a refrigerant in gas phase state is referred to as a "gas phase refrigerant." A plurality of fins 42 that protrudes from the bottom plate portion 32 may be provided in the space 40. In FIG. 2, a small number of fins 42 are illustrated for clarity of illustration. The bottom plate portion 32, the cover portion 34, and the plurality of fins 42 are formed of, for example a metal having a high thermal conductivity such as copper or aluminum.

Figure 3A:
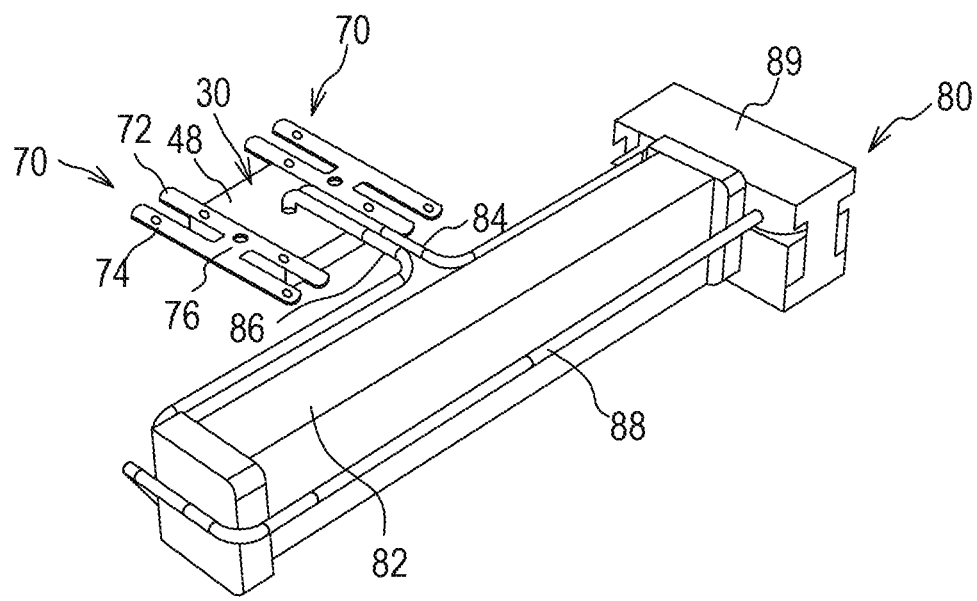
FIG. 3A is a perspective view illustrating a cooling mechanism including the heat exchanger.
Figure 3B:
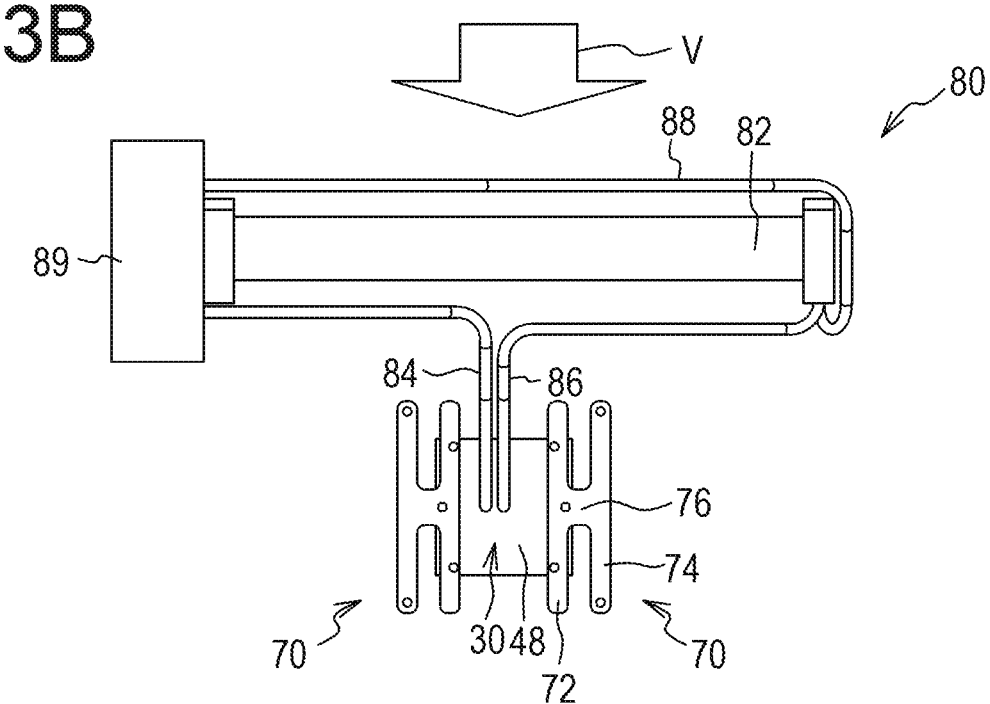
FIG. 3B is a plan view thereof.

Here, cooling of the heat generating component 20 by the heat exchanger 30 will be described with reference to FIGS. 2 to 3B. FIG. 3A is a perspective view illustrating a cooling mechanism including the heat exchanger, and FIG. 3B is a plan view thereof. As illustrated in FIGS. 2 to 3B, a cooling mechanism 80 includes the heat exchanger 30, the condenser 82, a refrigerant discharge pipe 84, a refrigerant supply pipe 86, a pipe 88, and a pump 89.

The refrigerant discharge pipe 84 and the refrigerant supply pipe 86 are connected to the upper surface 48 of the heat exchanger 30, and communicate with the space 40 formed inside the heat exchanger 30. When the liquid phase refrigerant 44 stored in the space 40 of the heat exchanger 30 evaporates by heat exchange with the heat generating component 20, latent heat of vaporization is deprived from the heat generating component 20, so that the heat generating component 20 is cooled. A gas phase refrigerant 46 generated followed by the evaporation of the liquid phase refrigerant 44 is supplied to the condenser 82 via the refrigerant discharge pipe 84, the pump 89, and the pipe 88.

The condenser 82 is, for example, a radiator. As illustrated by an arrow V, cooling air is blown to the condenser 82 from a cooling fan (not illustrated). Therefore, heat of the gas phase refrigerant 46 supplied to the condenser 82 is radiated to the atmosphere (cooling air). Therefore, the gas phase refrigerant 46 is condensed, and the liquid phase refrigerant 44 is generated. The liquid phase refrigerant 44 generated in the condenser 82 is supplied to the space 40 of the heat exchanger 30 via the refrigerant supply pipe 86.

As described above, the cooling mechanism 80 adopts a phase change cooling method in which the liquid phase refrigerant 44 is evaporated by the heat of the heat generating component 20, and the latent heat of vaporization followed by the evaporation of the liquid phase refrigerant 44 is deprived from the heat generating component 20, and thereby the heat generated component 20 is cooled. Therefore, the space 40 of the heat exchanger 30 is depressurized and has a pressure lower than the atmospheric pressure. As a result, since the phase change of the liquid phase refrigerant 44 is promoted, the liquid phase refrigerant 44 stored in the space 40 is easily evaporated and the cooling of the heat generating component 20 may be promoted.

As illustrated in FIGS. 1, 3A, and 3B, the leaf springs 70 have a flat plate shape, and are fixed to the upper surface 48 of the heat exchanger 30. The leaf springs 70 are fixed to the upper surface 48 of the heat exchanger 30, for example, at an outer peripheral portion within the upper surface 48 of the heat exchanger 30. The leaf springs 70 are provided on both sides of the upper surface 48 of the heat exchanger 30 such that a portion of the upper surface 48 to which the refrigerant discharge pipe 84 and the refrigerant supply pipe 86 are connected is interposed therebetween. That is, each of a pair of leaf springs is symmetrically provided on each of a pair of opposing sides of the upper surface 48 of the heat exchanger 30. The leaf spring 70 is made of, for example, a metal having a higher rigidity rate than the heat exchanger 30, so as to have a higher rigidity than the heat exchanger 30. As an example, the leaf spring 70 is made of stainless steel.

Each of the leaf springs 70 has, for example, an H shape. The leaf spring 70 having an H shape includes a first extending portion 72, a second extending portion 74, and a connection portion 76 that connects the first extending portion 72 and the second extending portion 74.

The first extending portion 72 of the leaf spring 70 overlaps with the outer peripheral portion within the upper surface 48 of the heat exchanger 30, and extends linearly between a pair of opposing sides of the heat exchanger 30. Although the first extending portion 72 extends to the outside of the heat exchanger 30, the first extending portion 72 may not extend to the outside of the heat exchanger 30. Screw holes 50 are formed on the upper surface 48 of the heat exchanger 30. Through holes 78 are formed in the first extending portion 72 at positions corresponding to the screw holes 50. A screw 92 inserted into a through hole 78 in the first extending portion 72 is mounted in a screw hole 50 formed on the upper surface 48 of the heat exchanger 30. Therefore, the first extending portion 72 is fixed to the outer peripheral portion within the upper surface 48 of the heat exchanger 30 by the screw 92. That is, the leaf spring 70 is fixed to the outer peripheral portion within the upper surface 48 of the heat exchanger 30 by the screw 92. The screw 92 is an example of a second screw.

The second extending portion 74 of the leaf spring 70 extends linearly in parallel with the first extending portion 72 at the outside of the heat exchanger 30. A length of the second extending portion 74 is, for example, the same as that of the first extending portion 72, but may have a different length from that of the first extending portion 72. Through holes 79 are formed in the tip portion of the second extending portion 74. A screw 90 inserted into a through hole 79 in the second extending portion 74 is mounted to a screw receiver 96 formed on the mounting plate 94 arranged on a surface of the other side of a surface of the printed circuit board 10 on which the heat generating component 20 is mounted, via a through hole 12 formed in the printed circuit board 10. Therefore, the second extending portion 74 is fixed to the printed circuit board 10 by the screw 90. That is, the leaf spring 70 is fixed to the printed circuit board 10 by the screw 90. The screw 90 is an example of a first screw. Force that presses the heat exchanger 30 toward the heat generating component 20 is generated by fixing the leaf spring 70 to the printed circuit board by the screw 90. Therefore, it is expected that the heat conduction between the heat generating component 20 and the heat exchanger 30 is improved.

The connection portion 76 connects, for example, a central portion of the first extending portion 72 in the extending direction and a central portion of the second extending portion 74 in the extending direction.

Figure 4A:
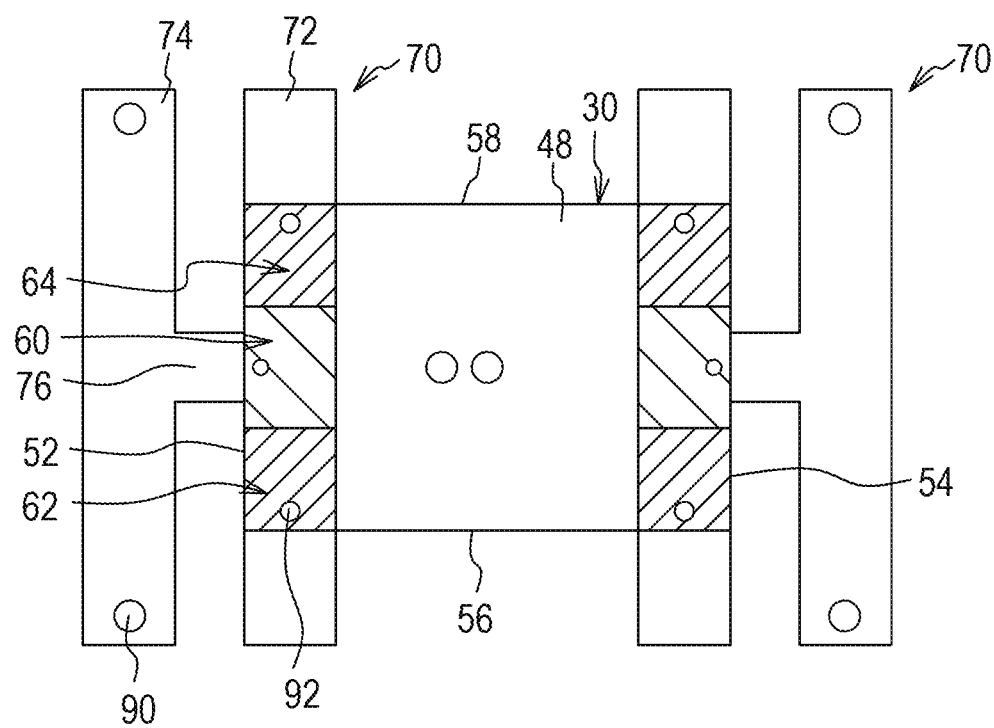
FIG. 4A is a plan view illustrating the heat exchanger.
Figure 4B:
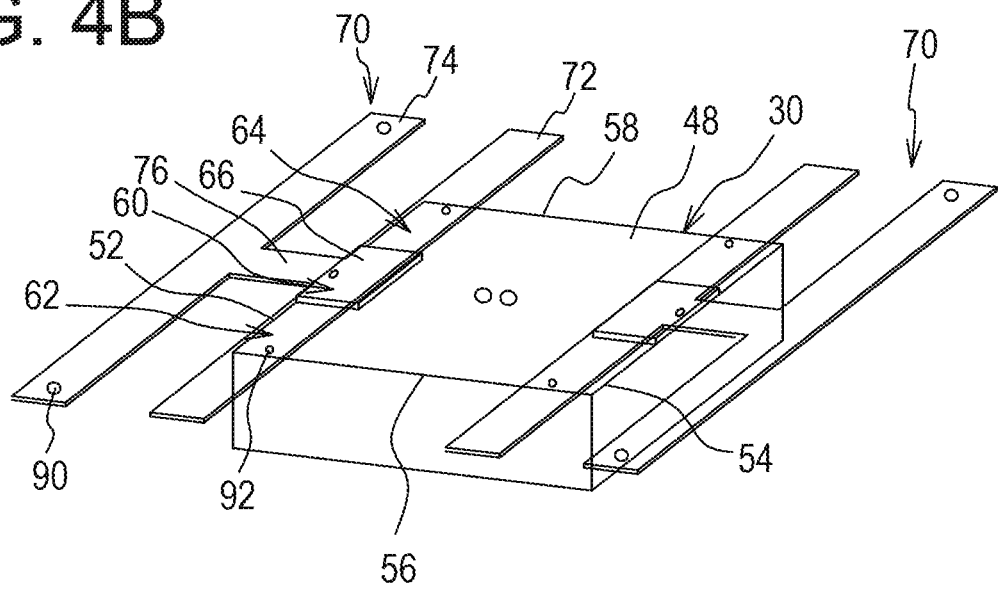
FIG. 4B is a perspective view thereof.

FIG. 4A is a plan view illustrating the heat exchanger, and FIG. 4B is a perspective view thereof. As illustrated in FIG. 4A, the upper surface 48 of the heat exchanger 30 includes sides 52, 54, 56, and 58. The side 52 and the side 54 are opposite to each other, and the side 56 and the side 58 are opposite to each other. One of the pair of the leaf springs 70 is provided toward the side 52, and the other is provided toward the side 54. The first extending portion 72 of the leaf spring 70 extends linearly across the side 56 and the side 58 of the upper surface 48 of the heat exchanger 30. The second extending portion 74 of the leaf spring 70 extends linearly in parallel with the first extending portion 72.

In a region of the upper surface 48 of the heat exchanger 30 that overlaps with the first extending portion 72 of the leaf spring 70, a portion that includes the center between the side 56 and the side 58 is referred to as a "central portion 60." A portion toward the side 56 from the central portion 60 is referred to as a "first portion 62" and a portion toward the side 58 from the central portion 60 is referred to as a "second portion 64. In FIG. 4A, the central portion 60, the first portion 62, and the second portion 64 are illustrated by hatching. The central portion 60 may be a portion that includes the center between the side 56 and the side 58, for example, a portion in the middle when the distance between the side 56 and the side 58 is equally divided into three, and for example, two portions in the middle when the distance between the side 56 and the side 58 is equally divided into four.

As illustrated in FIG. 4B, a raised portion 66 that protrudes in a convex shape higher than the first portion 62 and the second portion 64 is formed in the central portion 60 of the upper surface 48 of the heat exchanger 30. The raised portion 66 has, for example, a symmetrical shape with respect to a center line between the side 56 and the side 58. The height of the raised portion 66 is, for example, about 0.5 mm. The first extending portion 72 of the leaf spring 70 is fixed to the upper surface 48 of the heat exchanger 30 by the screws 92 at the central portion 60, the first portion 62, and the second portion 64. For example, the screw 92 in the central portion 60 is mounted on the center line between the side 56 and the side 58, and the screw 92 in the first portion 62 and the screw 92 in the second portion 64 are mounted at symmetrical positions with respect to the center line between the side 56 and the side 58.

Figure 5:
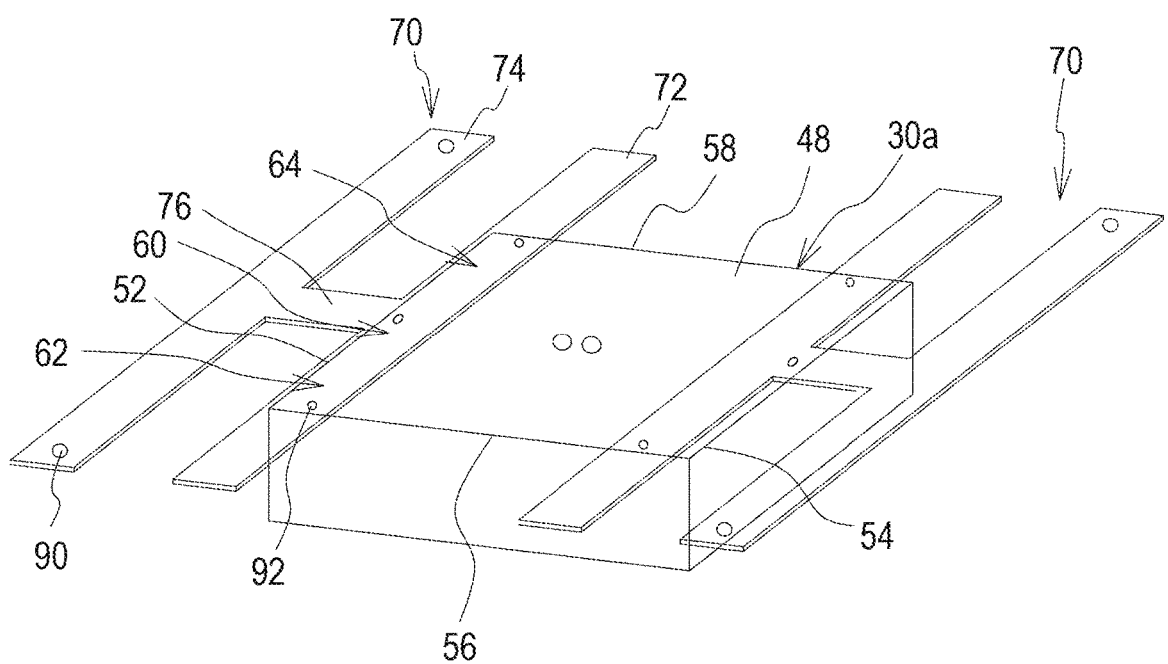
FIG. 5 is a perspective view illustrating the heat exchanger included in a cooling system according to a comparative example.

Here, in describing an effect of the cooling system 100 of the first embodiment, the cooling system of the comparative example will be described. FIG. 5 is a perspective view illustrating the heat exchanger included in a cooling system according to a comparative example. As illustrated in FIG. 5, in the cooling system of the comparative example, the upper surface 48 of a heat exchanger 30a is a flat surface and a raised portion is not formed thereon. Since other configurations are the same as those of the first embodiment, descriptions will be omitted.

Figure 6:
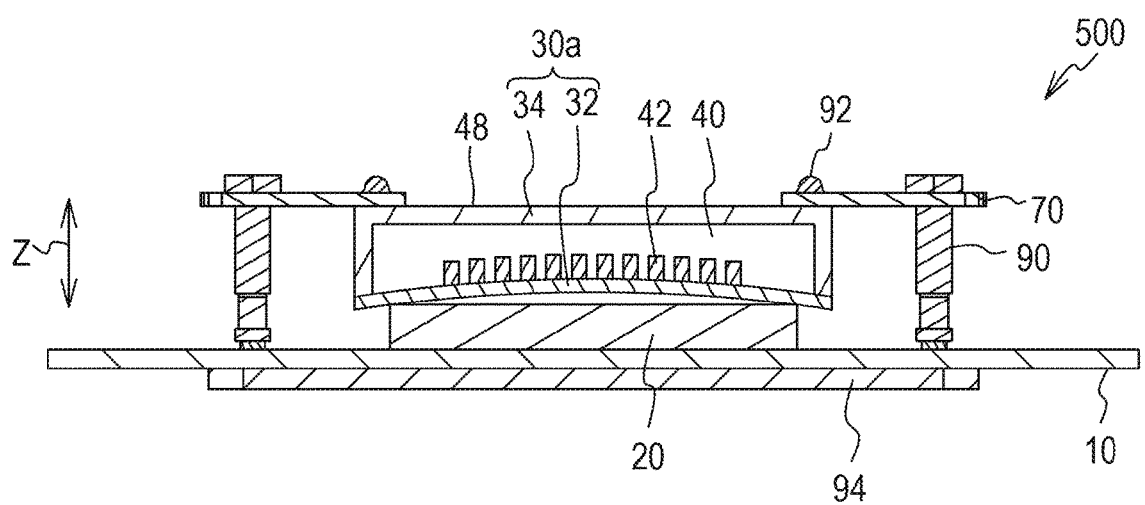
FIG. 6 is a cross-sectional view for explaining a problem of the cooling system according to the comparative example.

FIG. 6 is a cross-sectional view for explaining a problem of the cooling system according to the comparative example. As illustrated in FIG. 6, in the cooling system 500 of the comparative example, warping may occur in a bottom plate portion 32 of the heat exchanger 30a in which a central portion becomes concave in a direction away from the heat generating component 20. Such warping in the bottom plate portion 32 is referred to as "concave warping." The concave warping occurs in the bottom plate portion 32 of the heat exchanger 30a due to the following reason. That is, the outer shape of the heat exchanger 30a is larger than the outer shape of the heat generating component 20 when viewed from the thickness direction of the printed circuit board 10. In this case, it is considered that a corner portion of the heat generating component 20 serves as a point and the concave warping occurs in the bottom plate portion 32, by fastening the screw 90 that fixes the leaf spring 70 to the printed circuit board 10. Further, it is considered that the concave warping occurs easily in the bottom plate portion 32 when depressurization processing is performed in the space 40 in the heat exchanger 30a. When the concave warping occurs in the bottom plate portion 32, the cooling effect on the heat generating component 20 is deteriorated since the contact area between the heat exchanger 30a and the heat generating component 20 decreases.

Figure 7A:
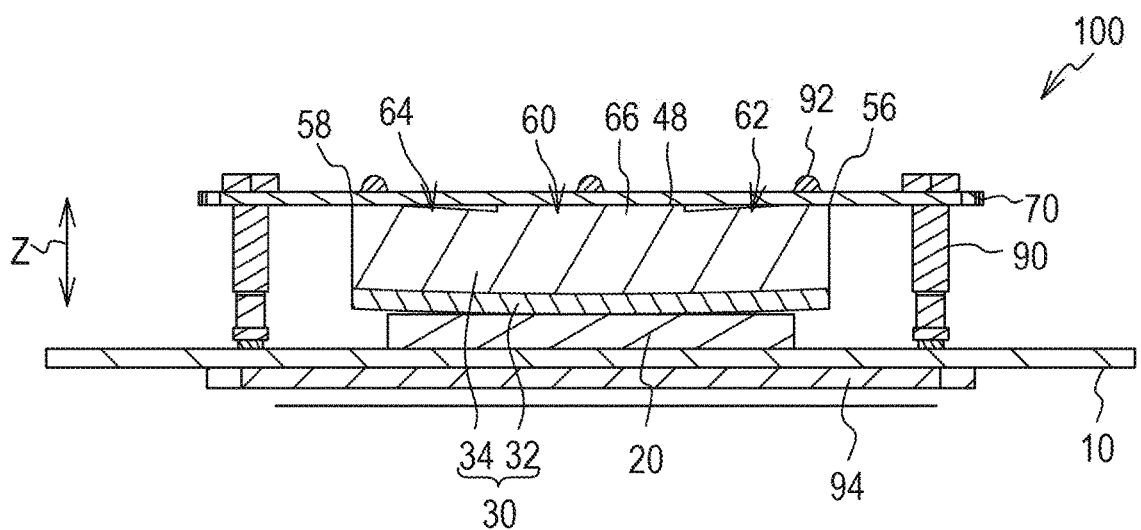
FIG. 7A is a side view illustrating the cooling system according to the first embodiment.
Figure 7B:
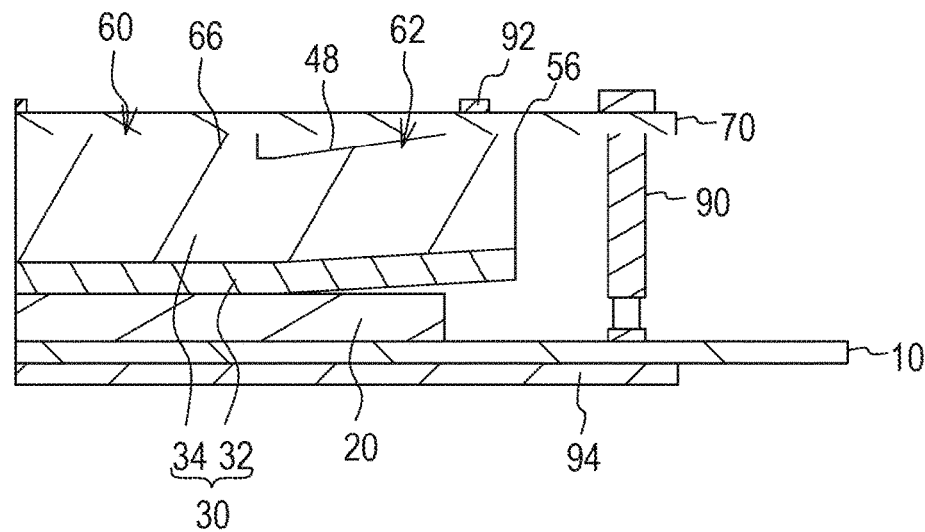
FIG. 7B is an enlarged view illustrating a part of FIG. 7A.

FIG. 7A is a side view illustrating the cooling system according to the first embodiment, and FIG. 7B is an enlarged view illustrating a part of FIG. 7A. In FIGS. 7A and 7B, hatching is applied to each part for the sake of clarity of the drawings. As described with reference to FIG. 4B, in the first embodiment, the raised portion 66 is formed in the central portion 60 of a region of the upper surface 48 of the heat exchanger 30 that overlaps with the first extending portion 72 of the leaf spring 70. As a result, as illustrated in FIGS. 7A and 7B, when the leaf spring 70 is fixed to the upper surface 48 of the heat exchanger 30, the first portion 62 side and the second portion 64 side of the upper surface 48 of the heat exchanger 30 are warped toward the side opposite to the heat generating component 20. Therefore, end portions of the bottom plate portion 32 of the heat exchanger 30 are warped toward the side opposite to the heat generating component 20, and warping occurs in the bottom plate portion 32 in which the end portions becomes concave in a direction away from the heat component 20. Such warping in the bottom plate portion 32 is referred to as "convex warping."

When the screw 90 for fixing the leaf spring 70 to the printed circuit board 10 is fastened in a state where the convex warping occurs in the bottom plate portion 32 of the heat exchanger 30, it is considered that the concave warping in the bottom plate portion 32 in which the corner portion of the heat generating component 20 serves as a point is difficult to occur. Therefore, it is considered that the warping of the bottom plate portion 32 may be reduced by adjusting the convex warping amount of the bottom plate portion 32 by, for example, adjusting the height of the raised portion 66.

Here, with respect to the cooling system of the first embodiment and the cooling system of the comparative example, a simulation in which warping amount of the bottom plate portion 32 of the heat exchanger 30 is evaluated when four screws 90 are fastened with a force of 50 kgf will be described. In the simulation, the bottom plate portion 32 and the cover portion 34 of the heat exchanger 30 and 30a, and the mounting plate 94 were formed of copper, the leaf spring 70, the screws 90 and 92 were formed of stainless steel, and the printed circuit board 10 were a FR4 substrate. The heat generating component 20 had a rectangular parallelepiped shape having a size of length×width×height of 51.0 mm×63.8 mm×5.0 mm, and the heat exchanger 30 had a rectangular parallelepiped shape having a size of length× width×height of 74.0 mm×74.0 mm×11.4 mm. The raised portion 66 had a symmetrical shape with respect to the center line between the side 56 and the side 58, a length thereof in a direction in which the side 56 and the side 58 are opposite to each other was 0.4 times the distance between the side 56 and the side 58, and the height thereof was 0.5 mm.

The results of the simulation are exhibited in Table 1. A warping amount ratio is a distance between the bottom plate portion 32 and the heat generating component 20 in the first embodiment, when the maximum distance between the bottom plate portion 32 and the heat generating component 20 in the first comparative example is 100%.

TABLE 1

|  | WARPING AMOUNT RATIO [%] |
|---|---|
| FIRST COMPARATIVE EXAMPLE | 100 |
| FIRST EMBODIMENT | 64 |

As shown in Table 1, the warping of the bottom plate portion 32 of the heat exchanger 30 was reduced in the first embodiment as compared with the first comparative example. As described above, the result is considered to be due to the fact that the concave warping in the bottom plate portion 32 is difficult to occur by fastening the screw 90 for fixing the leaf spring 70 to the printed circuit board 10 in a state where the convex warping occurs in the bottom plate portion 32.

According to the first embodiment, as illustrated in FIG. 4B, the raised portion 66 that protrudes higher than the first portion 62 on the side of the side 56 and the second portion 64 on the side of the side 58 is formed in the central portion 60 of the upper surface 48 of the heat exchanger 30 between the side 56 and the side 58 as a region that overlaps with the leaf spring 70. Therefore, as illustrated in FIGS. 7A and 7B, the convex warping may occur in the bottom plate portion 32 of the heat exchanger 30. Therefore, the occurrence of the concave warping in the bottom plate portion 32 of the heat exchanger 30 may be suppressed even in a case where the leaf spring 70 is fixed to the printed circuit board 10 by the screw 90, and as a result, the warping of the heat exchanger 30 may be reduced. When the height of the raised portion 66 is too high, the convex warping amount of the bottom plate portion 32 increases, so that the contact area between the heat generating component 20 and the heat exchanger 30 decreases. Meanwhile, when the height of the raised portion 66 is too low, it is difficult to control the occurrence of the concave warping in the bottom plate portion 32, so that the contact area between the heat generating component 20 and the heat exchanger 30 decreases. Therefore, the height of the raised portion 66 may be a height that is able to suppress the concave warping in the bottom plate portion 32 and to suppress the convex warping amount to be small.

As illustrated in FIG. 4B, the leaf spring 70 may be fixed to the heat exchanger 30 by the screws 92 at the central portion 60, the first portion 62, and the second portion 64 of the upper surface 48 of the heat exchanger 30. Therefore, it is possible to warp efficiently the first portion 62 side and the second portion 64 side of the upper surface 48 of the heat exchanger 30 toward the side opposite to the heat generating component 20, and the convex warping may occur efficiently in the bottom plate portion 32.

Further, as in the first embodiment, the leaf spring 70 may have a higher rigidity than the heat exchanger 30. For example, the leaf spring 70 may be formed of a material having a higher rigidity than the heat exchanger 30. As an example, the leaf spring 70 may be formed of stainless steel in a case where the heat exchanger 30 is formed of copper or aluminum. Therefore, the first portion 62 side and the second portion 64 side of the upper surface 48 of the heat exchanger 30 are easily warped, and the convex warping may be efficiently occur in the bottom plate portion 32, by fixing the leaf spring 70 to the upper surface 48 of the heat exchanger 30.

As illustrated in FIGS. 7A and 7B, in the heat exchanger 30, the end portions are curved in a direction away from the heat generating component 20 more than the central portion when the heat exchanger 30 is viewed from a side in a direction in which the side 56 and the side 58 of the upper surface 48 extend. Therefore, the occurrence of the concave warping in the bottom plate portion 32 of the heat exchanger 30 may be efficiently suppressed.

As illustrated in FIG. 2, in the heat exchanger 30, the space 40 that stores the liquid phase refrigerant 44 therein is formed by joining the bottom plate portion 32 and the cover portion 34. When the space 40 is formed inside the heat exchanger 30, the concave warping of the bottom plate portion 32 described with reference to FIG. 6 easily occurs. Therefore, in this case, the raised portion 66 may be provided on the central portion 60 of the region of the upper surface 48 of the heat exchanger 30 that overlaps with the leaf spring 70.

As described above, in order to promote the cooling of the heat generating component 20, the pressure in the space 40 of the heat exchanger 30 is lower than the atmospheric pressure. In this case, since the concave warping in the bottom plate portion 32 is more likely to occur, the raised portion 66 may be provided on the central portion 60 of the region of the upper surface 48 of the heat exchanger 30 that overlaps with the leaf spring 70.

Figure 8A:
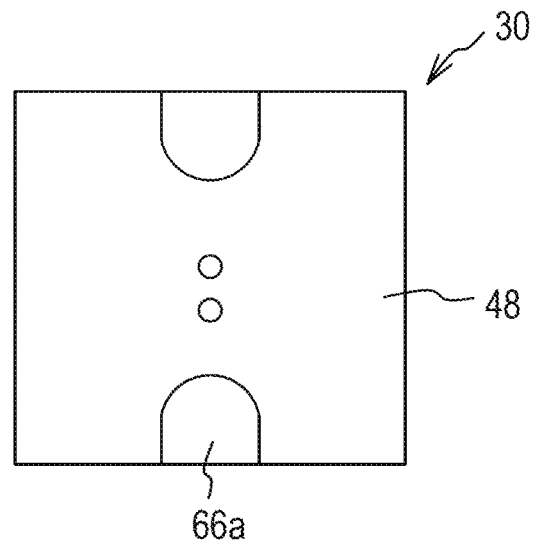
FIGS. 8A to 8C are plan views illustrating modified examples of raised portions formed on an upper surface of the heat exchanger.
Figure 8B:
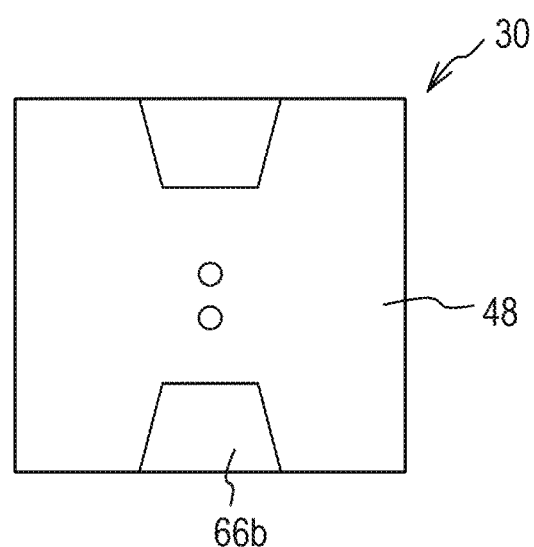
Figure 8C:
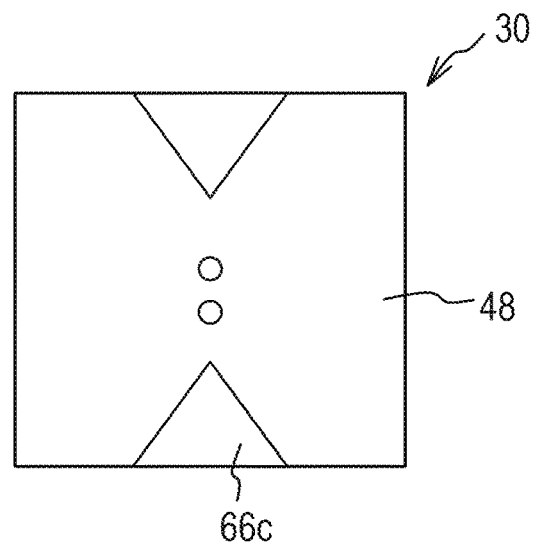

In the first embodiment, as illustrated in FIG. 4B, a case where the raised portion 66 has a rectangular shape when viewed from the thickness direction of the printed circuit board 10 is illustrated, but the present disclosure is not limited thereto. FIGS. 8A to 8C are plan views illustrating modified examples of raised portions formed on an upper surface of the heat exchanger. As illustrated in FIG. 8A, a raised portion 66a may have a shape formed by an arc and a straight line in plane view of the upper surface 48 of the heat exchanger 30. As illustrated in FIG. 8B, a raised portion 66b may have a trapezoidal shape in plane view of the upper surface 48 of the heat exchanger 30. As illustrated in FIG. 8C, a raised portion 66c may have a triangular shape in a plan view of the upper surface 48 of the heat exchanger 30.

Second Embodiment

Figure 9A:
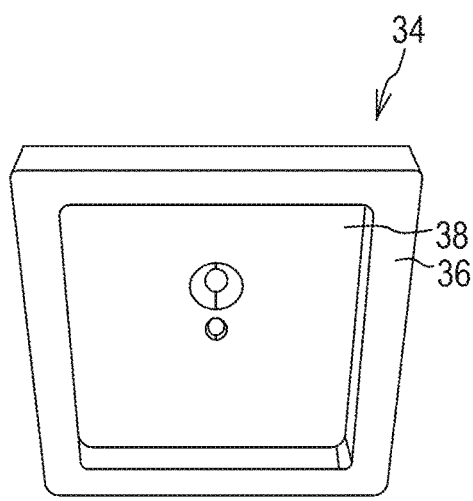
FIG. 9A is a perspective view illustrating a cover portion of the heat exchanger according to the first embodiment as viewed from the lower side.
Figure 9B:
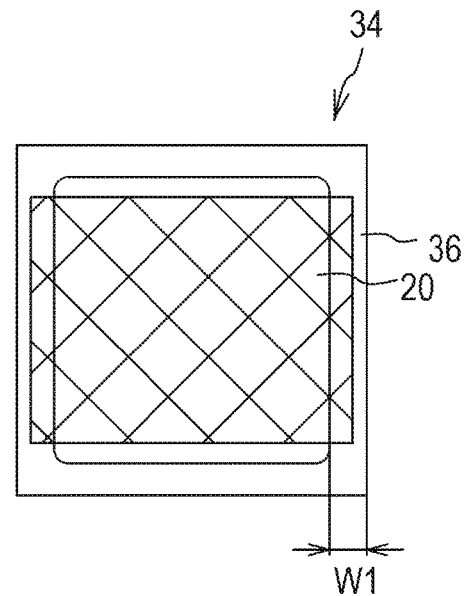
FIG. 9B is a plan view thereof.
Figure 9C:
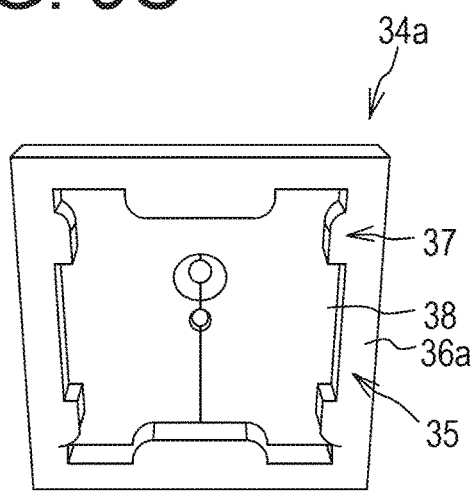
FIG. 9C is a perspective view illustrating a cover portion of a heat exchanger according to a second embodiment as viewed from the lower side.
Figure 9D:
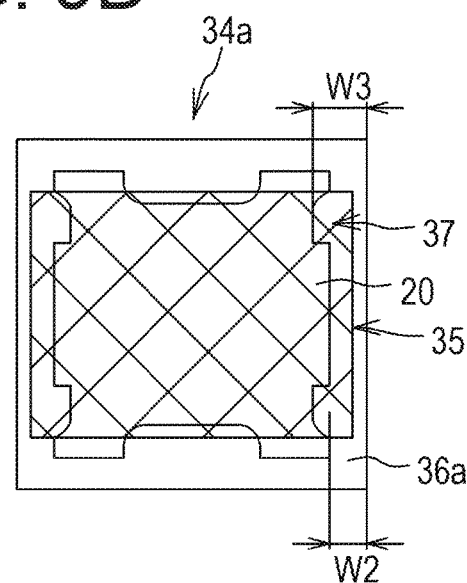
FIG. 9D is a plan view thereof.

FIG. 9A is a perspective view illustrating a cover portion of the heat exchanger according to the first embodiment as viewed from the lower side, and FIG. 9B is a plan view thereof. FIG. 9C is a perspective view illustrating a cover portion of a heat exchanger according to a second embodiment as viewed from the lower side, and FIG. 9D is a plan view thereof. In FIGS. 9B and 9D, a region where the heat generating component 20 is provided is indicated by hatching. As illustrated in FIGS. 9A and 9B, the side wall portion 36 has a constant width W1 in all portions of the frame shape in the cover portion 34 of the heat exchanger 30 of the first embodiment. The width W1 is, for example, 8 mm. The heat generating component 20 is arranged so as to overlap with each of the side wall portions 36 of the cover portion 34 facing each other.

As illustrated in FIGS. 9C and 9D, a side wall portion 36a includes a narrow width portion 35 having a narrow width and a wide width portion 37 wider than the narrow width portion 35 in a cover portion 34a of the heat exchanger 30 of the second embodiment. A width W2 of the narrow width portion 35 is the same as the width W1 of the side wall portion 36 of the first embodiment, for example, 8 mm. A width W3 of the wide width portion 37 is, for example, 11 mm. In the side wall portion 36a, for example, a portion where the screw 92 is mounted in FIG. 1 is the wide width portion 37. The heat generating component 20 is arranged so as to overlap with the narrow width portion 35 and the wide width portion 37 of each of the side wall portions 36a of the cover portion 34a facing each other. Since other configurations of the cooling system of the second embodiment are the same as those of the first embodiment, descriptions will be omitted.

Here, with respect to the cooling system of the second embodiment, a simulation in which warping amount of the bottom plate portion 32 of the heat exchanger 30 is evaluated will be described. The simulation was carried out under the same conditions as in the evaluation of the warping amount in the cooling system of the first embodiment and the cooling system of the comparative example described above.

The results of the simulation are exhibited in Table 2. In Table 2, the simulation results of the warping amount of the first comparative example and the first embodiment 1 are exhibited as well.

TABLE 2

|  | WARPING AMOUNT RATIO [%] |
| --- | --- |
| FIRST COMPARATIVE EXAMPLE | 100 |
| FIRST EMBODIMENT | 64 |
| SECOND EMBODIMENT | 55 |

As shown in Table 2, in the second embodiment, the warping of the bottom plate portion 32 of the heat exchanger 30 was reduced as compared with the first comparative example, and the warping of the bottom plate portion 32 of the heat exchanger 30 was further reduced as compared with the first embodiment. As described above, it is considered that the warping of the bottom plate portion 32 is further reduced in the second embodiment more than the first embodiment due to the following reason. That is, as illustrated in FIGS. 9A and 9B, the side wall portion 36 has the constant width W1 in the first embodiment, whereas, as illustrated in FIGS. 9C and 9D, the side wall portion 36a has the narrow width portion 35 and the wide width portion 37 in the second embodiment. Therefore, as illustrated in FIGS. 9B and 9D, the area where the side wall portion 36a overlaps with the heat generating component 20 is increased in the second embodiment as compared with the first embodiment. As the area where the side wall portion 36a and the heat generating component 20 overlap increases, the number of points supported by the bottom plate portion 32 increases, and the rigidity of the side wall portion 36a is higher than that of the heat generating component 20, so that it is considered that the warping of the bottom plate portion 32 is further reduced.

According to the second embodiment, as illustrated in FIGS. 9C and 9D, the side wall portion 36a includes the narrow width portion 35 and the wide width portion 37, and both of the narrow width portion 35 and the wide width portion 37 overlaps with the heat generating component 20 when viewed from the thickness direction of the printed circuit board 10. Therefore, it is possible to increase the area where the side wall portion 36a and the heat generating component 20 overlap, and further reduce the warping of the bottom plate portion 32.

Further, according to the second embodiment, the screw 92 that fixes the leaf spring 70 to the upper surface 48 of the heat exchanger 30 is mounted in the wide width portion 37 of the side wall portion 36a. Therefore, it is possible to warp efficiently the first portion 62 side and the second portion 64 side of the upper surface 48 of the heat exchanger 30 toward the side opposite to the heat generating component 20, and the convex warping may occur efficiently in the bottom plate portion 32.

In the first embodiment and the second embodiment, the case where the heat exchanger 30 has the space 40 therein in which the refrigerant circulating the heat exchanger 30 and the condenser 82 is stored is illustrated as an example, but the heat exchanger 30 may have other structures. The case where the leaf spring 70 has H shape is illustrated as an example, but the leaf spring 70 may have other shapes such as I shape or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling system comprising:
   a heat exchanger configured to be provided on a heat generating component mounted on a printed circuit board to cool the heat generating component, the heat exchanger having a size that is larger than the heat generating component as viewed in a thickness direction of the printed circuit board;
   a leaf spring configured to extend from a first side of an upper surface of the heat exchanger to a second side opposite to the first side, and be fixed to the upper surface of the heat exchanger; and
   a first screw configured to be arranged around the heat exchanger, and fix the leaf spring to the printed circuit board,
   the heat exchanger includes a convex portion on an upper surface thereof to be raised to be higher than a first portion of the first side and a second portion of the second side, and be formed at a central portion between the first portion and the second portion on a region of the upper surface of the heat exchanger that overlaps with the leaf spring.

2. The cooling system according to claim 1, further comprising:
   a second screw configured to fix the leaf spring to the heat exchanger at the central portion, the first portion, and the second portion of the upper surface of the heat exchanger.

3. The cooling system according to claim 1, wherein the leaf spring has a higher rigidity than the heat exchanger.

4. The cooling system according to claim 1, wherein an end portion of the heat exchanger is curved in a direction away from the heat generating component more than the central portion in a case where the heat exchanger is viewed from a side in a direction in which the first side and the second side extend.

5. The cooling system according to claim 1, wherein the leaf spring is fixed to an outer periphery of the upper surface of the heat exchanger.

6. The cooling system according to claim 1, wherein the heat exchanger includes:

a bottom plate portion on a side of the heat generating component, a cover portion having a concave shape and having a side wall portion that is joined to the bottom plate portion, and a space for storing a liquid phase refrigerant.

7. The cooling system according to claim 6, wherein pressure in the space is set lower than atmospheric pressure.

8. The cooling system according to claim 6, wherein the side wall portion includes a narrow width portion and a wide width portion wider than the narrow width portion, and wherein both of the narrow width portion and the wide width portion overlap with the heat generating component as viewed in the thickness direction of the printed circuit board.

9. The cooling system according to claim 2, wherein the heat exchanger includes a bottom plate portion on a side of the heat generating component, and a cover portion having a concave shape and having a side wall portion that is joined to the bottom plate portion, wherein the side wall portion includes a narrow width portion and a wide width portion that is wider than the narrow width portion and to which a second screw is mounted, and wherein both of the narrow width portion and the wide width portion overlap with the heat generating component as viewed in the thickness direction of the printed circuit board.

10. The cooling system according to claim 1, wherein the leaf spring includes:

a first extending portion that extends from the first side to the second side of the upper surface of the heat exchanger, a second extending portion that extends in parallel with the first extending portion at an outside of the heat exchanger, and a connection portion that connects the first extending portion and the second extending portion, and wherein the first fixing portion fixes the second extending portion of the leaf spring to the printed circuit board.

11. The cooling system according to claim 1, wherein the heat exchanger is made of copper or aluminum, and wherein the leaf spring is made of stainless steel.

* * * * *